United States Patent
Hayashida et al.

(10) Patent No.: US 8,130,386 B1
(45) Date of Patent: Mar. 6, 2012

(54) POSITION MEASURING METHOD

(75) Inventors: Toshio Hayashida, Omura (JP); Naoji Mitani, Omura (JP); Ayumi Kihara, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 321 days.

(21) Appl. No.: 12/224,467

(22) PCT Filed: Nov. 2, 2006

(86) PCT No.: PCT/JP2006/321992
§ 371 (c)(1),
(2), (4) Date: Jun. 4, 2009

(87) PCT Pub. No.: WO2007/097071
PCT Pub. Date: Aug. 30, 2007

(30) Foreign Application Priority Data

Feb. 27, 2006 (JP) .................................. 2006-050299

(51) Int. Cl.
*G01B 11/14* (2006.01)
(52) U.S. Cl. ....................................... 356/623; 356/622
(58) Field of Classification Search .......... 356/614–615, 356/620–623; 117/13–15, 200–203, 217, 117/904, 932, 900; 372/6–8, 16; 422/252–253; 250/577; 73/293; 359/515
See application file for complete search history.

(56) References Cited

U.S. PATENT DOCUMENTS

| | | | |
|---|---|---|---|
| 5,286,461 | A | 2/1994 | Koziol et al. |
| 5,292,486 | A | 3/1994 | Drechsel |
| 5,419,277 | A | 5/1995 | Urano et al. |
| 5,437,242 | A | 8/1995 | Hofstetter et al. |
| 5,882,402 | A | 3/1999 | Fuerhoff |
| 6,071,340 | A | 6/2000 | Li |
| 6,572,699 | B1 | 6/2003 | Moriya et al. |
| 2003/0116729 | A1 | 6/2003 | Moriya et al. |

FOREIGN PATENT DOCUMENTS

EP 610830 8/1994

(Continued)

OTHER PUBLICATIONS

International Search Report related to PCT/JP2006/321992.

*Primary Examiner* — Tri T Ton
(74) *Attorney, Agent, or Firm* — Husch Blackwell LLP (57) ABSTRACT

This invention provides a position measuring method for measuring a surface level of melt in a crucible arranged in the inside of a Czochralski furnace based on a principle of triangulation, in which a light source and a photo detector are provided; light emitted from the light source is applied to the surface of the melt; and the light reflected by the surface of the melt is received by the photo detector, the method comprising: providing a member in the vicinity of the surface of the melt; and causing the emitted light to be reflected by the member, applying the reflected light to the surface of the melt, and causing the light reflected by the surface of the melt to be received by the photo detector.

2 Claims, 7 Drawing Sheets

SIDE VIEW (X-Y PLANE)

FOREIGN PATENT DOCUMENTS

| | | |
|---|---|---|
| JP | 63-292015 | 11/1988 |
| JP | 06-042914 | 2/1994 |
| JP | 06-281415 | 10/1994 |
| JP | 07-243911 | 9/1995 |
| JP | 2627695 | 7/1997 |
| JP | 2627696 | 7/1997 |
| JP | 2816627 | 10/1998 |
| JP | 2000-258227 | 9/2000 |
| JP | 2000-264779 | 9/2000 |
| JP | 3129571 | 1/2001 |
| JP | 2002-013966 | 1/2002 |
| WO | WO01/83859 A1 | 11/2001 |

| MEASUMENT METHOD | TYPE OF RETURN LIGHT | MEASUREMENT FREQUENCY | POWER OF LASER |
|---|---|---|---|
| PRESENT INVENTION | SCATTERED LIGHT | HIGH | MEDIUM |
| DIRECT REFLECTION METHOD | DIRECT LIGHT | LOW | LOW |
| RETURN REFLECTION METHOD | SCATTERED LIGHT | HIGH | HIGH |

FIG.5

| CONDITION | PRESENT INVENTION | DIRECT REFLECTION METHOD | RETURN REFLECTION METHOD |
|---|---|---|---|
| (CONDITION 1) INTERVAL D GREAT, INTERVAL L MEDIUM | ○ | ◎ | ------- |
| (CONDITION 2) INTERVAL D MEDIUM, INTERVAL L GREAT | ◎ | × | △ |
| (CONDITION 3) INTERVAL D SMALL, INTERVAL L GREAT | △ | × | △ |
| (CONDITION 4) INTERVAL D SMALL, INTERVAL L SMALL | △ | × | × |

◎ EXCELLENT  ○ GOOD  △ FAIR  × POOR

FIG.6

FIG. 7A SIDE VIEW (X-Y PLANE)

FIG. 7B FRONT VIEW (X-Z PLANE)

POSITION MEASURING METHOD

TECHNICAL FIELD

The present invention relates to a position measuring method based on a principle of triangulation and, in particular, to a method for measuring a surface level of raw material melt in a single-crystal pulling device employing the Czochralski method.

BACKGROUND ART

The Czochralski method (hereafter, referred to as the "CZ method") is a method in which a single-crystal ingot is grown by pulling it from raw material melt such as silicon melt placed in a crucible. In order to grow a single crystal with high controllability, the surface level of the raw material melt (hereafter, referred to as the "melt level") must be measured accurately to adjust the level position according to the growth of the single crystal.

In a silicon single crystal pulling device using the CZ method, in particular, a heat shield is usually provided for controlling heat radiation from a heater and silicon melt and for straightening gas introduced into a CZ furnace.

The thermal history and impurity concentration (e.g. oxygen concentration) of single crystals to be pulled can be made constant by controlling the relative position (i.e. distance) between the lower surface of the heat shield and the melt level.

The prior art has proposed several melt level measurement methods in this regard.

The under-mentioned Patent Document 1 discloses a method based on the principle of triangulation, in which accurate melt level measurement is realized by using a melt surface shape constantly generated by motion in the melt surface and cause the same to function as a kind of reflector. Hereafter, this measurement method is referred to as a direct reflection method.

Figure 7A:
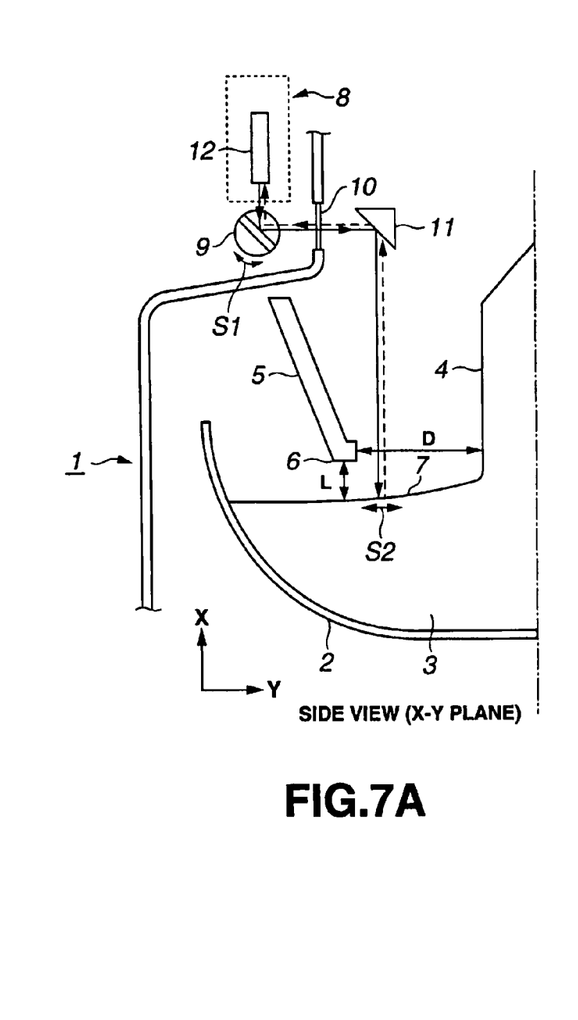
FIGS. 7a and 7B are a diagram for explaining a laser beam trajectory according to a conventional art example.
Figure 7B:
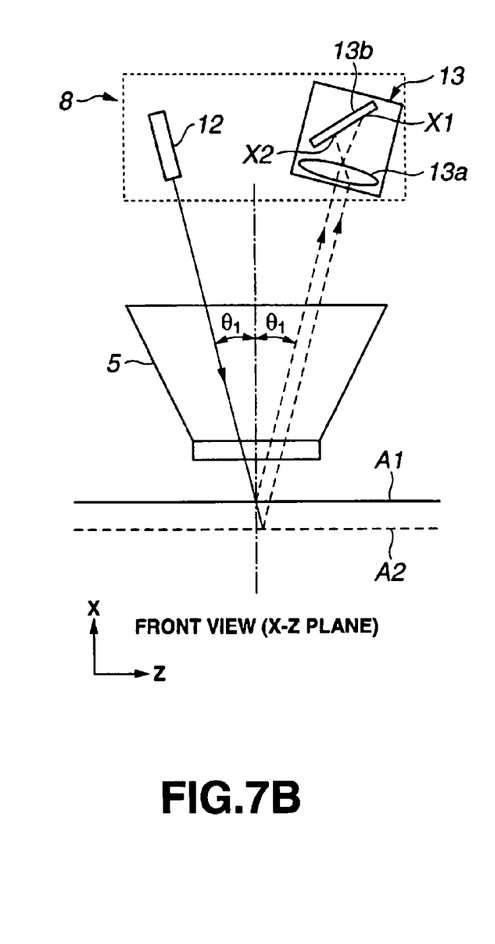

FIGS. 7A and 7B are a diagram for explaining a laser beam trajectory according to the direct reflection method. FIG. 7A is a schematic diagram showing the laser beam trajectory as viewed from a side (in an X-Y plane). FIG. 7B is a schematic diagram showing the laser beam trajectory as viewed from the front (in an X-Z plane). It should be understood that although a laser beam is guided by a rotating mirror 9 and a prism 11 in FIG. 7A, the rotating mirror 9 and the prism 11 are omitted in FIG. 7B since the laser beam trajectory in a Y-axis direction is perpendicular to the paper surface of FIG. 7B. Other parts and components that are not essential in terms of the triangulation are also omitted for simplification of illustration.

In FIGS. 7A and 7B, a silicon material 3 is molten within a crucible 2 provided in a CZ furnace 1, and a silicon single crystal 4 is being grown while being pulled up and rotated. A heat shield 5 is arranged around the outside of the silicon single crystal 4. An interval between the inner circumference of the lower end of the heat shield 5 and the peripheral wall of the silicon single crystal 4 is represented by D, and an interval between the lower surface 6 of the heat shield 5 and the melt surface 7 is represented by L.

The invention described above employs a distance measurement unit 8 based on the principle of triangulation for measuring the level of the melt surface 7.

As shown in FIG. 7B, there are provided, in the inside of the distance measurement unit 8, a laser beam source 12 for emitting a laser beam and a photo detector 13 for receiving return light that has been reflected. There are provided, in the photo detector 13, a lens 13a for collecting an incident laser beam and a one-dimensional CCD sensor 13b for detecting the collected laser beam.

A laser beam emitted from the distance measurement unit 8 is reflected by the rotating mirror 9, passes through an entrance window 10, and is applied to the melt surface 7 via a prism 11 provided in the CZ furnace 1.

The rotating mirror 9 is rotated clockwise or anticlockwise (indicated by the arrow S1 in the figure) to scan the position on the melt surface 7 where the laser beam is applied in a radial direction of the crucible 3 (indicated by the arrow S2 in the figure), so that the return light reflected by the melt surface 7 is received by the photo detector at a predetermined frequency via the prism 11, the entrance window 10, and the rotating mirror 9. According to the direct reflection method, as described above, a laser beam emitted by the laser beam source is directly applied to the melt surface 7, and the return light reflected by the melt surface 7 is directly received by the photo detector 13.

When the melt level of the melt surface 7 is at a position A1, the laser beam reflected by the melt surface 7 is detected at measurement coordinates X1 of the one-dimensional CCD sensor 13. This means that the measurement coordinates X1 of the one-dimensional CCD sensor 13 correspond to the melt level A1. Likewise, when the melt level is at a position A2, the laser beam reflected by the melt surface 7 is detected at measurement coordinates X2 of the one-dimensional CCD sensor 13. This means that the measurement coordinates X2 of the one-dimensional CCD sensor 13 correspond to the melt level A2. In this manner, according to the principle of triangulation, the melt level can be calculated from the measurement coordinates detected by the one-dimensional CCD sensor 13.

Although the angle of incidence and the angle of reflection of a laser beam at the melt surface 7 (both represented by an angle $\theta 1$) are shown greater than actual one in the figure, the angle $\theta 1$ actually is a small angle of a few degrees. This applies to other cases as well.

The direct reflection method, which uses a melt surface shape generated in the melt surface as a reflector, is suitable for a case in which a single crystal is pulled without applying a magnetic field to the periphery of the melt. The method also enables measurement regardless of the magnitude of interval L. Since the return light is reflected light directly from the melt surface 7, high laser power is not required.

The under-mentioned Patent Document 2 discloses a method for measuring a melt level by scattering a laser beam emitted by a laser beam source once at the lower surface of a heat shield, and reflecting the laser beam twice at the melt surface. This measurement method is hereafter referred to as the return reflection method. In the return reflection method, a magnetic field must be applied to the melt to eliminate undulation of the melt surface, that is, to smoothen the melt surface for the purpose of efficient utilization of the two reflections and one scattering.

Figure 8A:
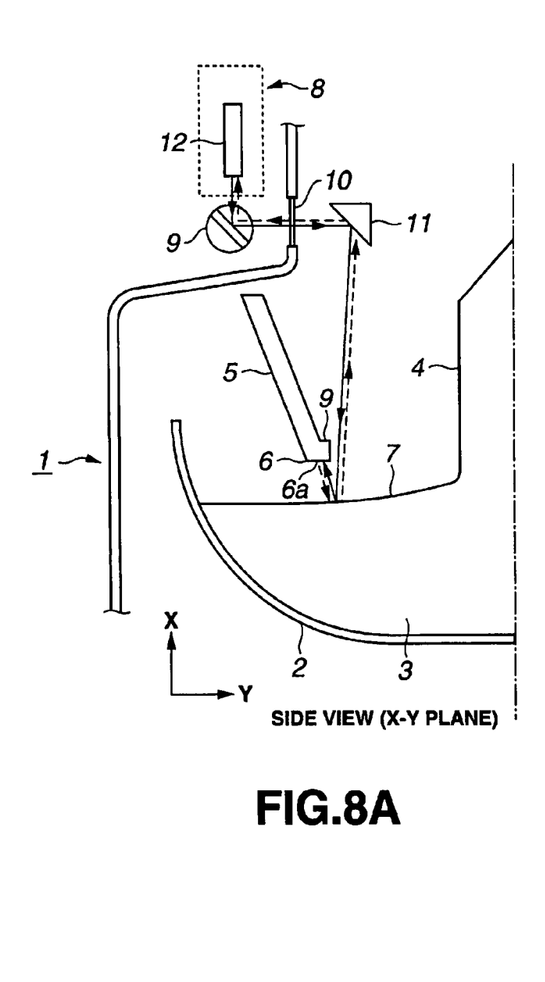
FIGS. 8A and 8B are a diagram for explaining a position measuring method according to another conventional art example.
Figure 8B:
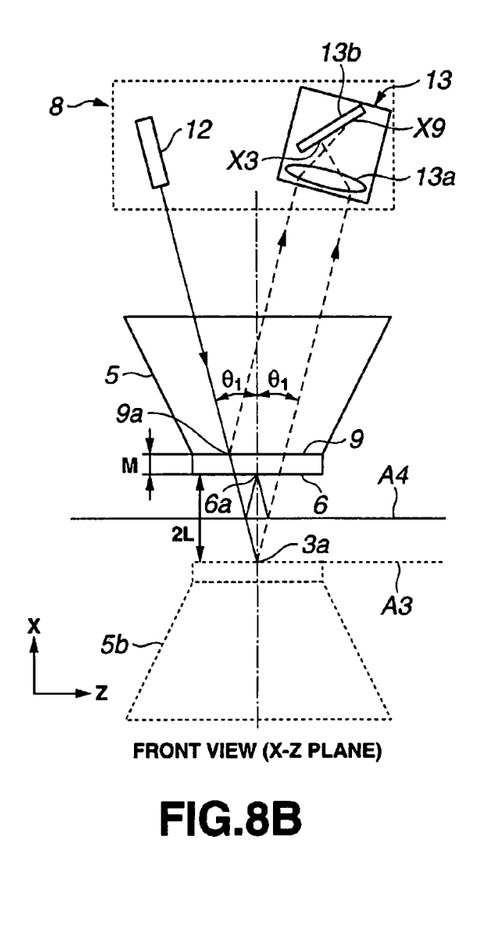

FIGS. 8A and 8B are a diagram for explaining a position measuring method based on the return reflection method.

FIG. 8A is a schematic diagram showing a laser beam trajectory as viewed from a side (in the X-Y plane). FIG. 8B is a schematic diagram showing the laser beam trajectory as viewed from the front (in the X-Z plane). Although a laser beam is guided by a rotating mirror 9 and a prism 11 in FIG. 8A, the rotating mirror 9 and the prism 11 are omitted in FIG. 8B since the laser beam trajectory in a Y-axis direction is perpendicular to the paper surface of FIG. 8B. Other parts and components that are not essential in terms of the triangulation are also omitted for simplification of illustration.

As shown in FIG. 8B, there are provided, in the inside of a distance measurement unit 8, a laser beam source 12 for emitting a laser beam and a photo detector 13 for receiving return light that has been reflected. There are arranged, in the photo detector 13, a lens 13a for collecting an incident laser beam and a one-dimensional CCD sensor 13b for detecting the collected laser beam.

As shown in FIGS. 8A and 8B, a laser beam emitted by the laser beam source 12 is reflected by the rotating mirror 9 and the prism 11 and applied to a melt surface 7. The laser beam thus applied is reflected by the melt surface 7 (melt level A4), and the reflected light is applied to the lower surface 6 of a heat shield 5 provided above the melt surface 7. The applied laser beam is scatted at a scattering point 6a on the lower surface 6 of the heat shield, and the scattered light is again applied to the melt surface 7. The laser beam thus applied is again reflected by the melt surface 7, and the reflected light is finally received by the photo detector 13.

This means that the laser beam received by the photo detector 13 is reflected light of a laser beam that has been applied to the melt surface 7 from the scattering point 6a of the lower surface 6 of the heat shield, and hence it is detected by the photo detector 13 as a laser beam emitted from a scattering point 3a on an apparent reflection surface.

The angle of incidence and the angle of reflection of a laser beam always take a same value in the X-Z plane in FIG. 8B. Based on simple geometrical consideration, the scattering point 3a on the apparent reflection surface and the scattering point 6a on the lower surface 6 of the heat shield 5 are in a positional relationship in which they are symmetrical with respect to the melt level A4 (mirror relationship). The apparent reflection surface is hereafter referred to as the "melt level A3". In FIG. 8B, the apparent heat shield 5b that is symmetrical to the heat shield 5 with respect to the actual melt level A4 is also shown by a dot line in order to help understanding of an apparent laser beam trajectory. Accordingly, the interval between the lower surface 6 of the heat shield 5 and the apparent melt level A3 is 2L.

The position of the lower surface 6 of the heat shield 5 can be obtained, for example, by measuring the position of the upper surface 9 of the lower end portion of the heat shield 5. In FIG. 8B, the position of the laser beam reflection point 9a on the upper surface 9 of the lower end portion of the heat shield 5 corresponds to the measurement coordinates X9 of the one-dimensional sensor. If it is assumed that the distance M between the upper surface 9 and the lower surface 6 has been measured in advance, the position of the lower surface 6 of the heat shield can be obtained based on the measurement coordinates X9 and the distance M.

The interval L can be obtained as a half of the relative distance 2L between the position of the lower surface 6 of the heat shield and the apparent melt level A3. The actual melt level A4 can be obtained as a value obtained by adding the interval L to the apparent melt level A3.

The return reflection method, utilizing scattered light scattered by the heat shield, has an advantage that the photo detector is able to receive light at a high light receiving probability.

Patent Document 1: Japanese Patent Application Laid-Open No. 2000-264779

Patent Document 2: WO01/083859

DISCLOSURE OF THE INVENTION

Problems to be Solved by the Invention

According to the direct reflection method described in Patent Document 1, the melt level must be measured at a predetermined frequency of measurement (number of measurements per unit time) in order to reduce variation in melt level measurement values.

In the case of the direct reflection method which uses as the reflector the constantly varying shape of the melt surface, however, the reflected light reflected directly from the reflector cannot be received in a stable manner, and therefore the frequency of measurement cannot be set a high value. This poses a problem of increased variation in measurement values, which makes it impossible to perform the measurement in a stable manner.

Further, if the diameter of a single crystal to be pulled is set to a great value, the value of the interval D is reduced. This increases the effect of meniscus generated on the side surface of the single crystal to be pulled. As a result, the reflected light reflected by the melt surface is not returned to the photo detector and thus the frequency of measurement becomes zero.

When the melt surface is smoothened by applying a magnetic field to the melt, the melt surface shape cannot be used as a reflector. This poses a problem that it is difficult to find a position where the reflected laser light is guided to the photo detector even by scanning with the laser beam in a radial direction of the crucible.

According to the return reflection method described in Patent Document 2, the return light is scattered light, and hence the frequency of measurement can be set to a high value. However, the intensity of the scattered light scattered at the lower surface of the heat shield is low. Moreover, the laser beam is reflected twice at the melt surface. As a result, the intensity of the laser beam finally received by the photo detector becomes low. If the laser beam power is increased to avoid this problem, it will pose a safety problem.

According to the return reflection method, like the direct reflection method, when the interval D is set to a low value, the reflected light cannot be guided to the photo detector due to the configuration in which the laser beam is scattered at the lower surface of the heat shield.

If the interval L is set to a low value for controlling the quality of a single crystal, the reflected light cannot be guided to the photo detector due to the configuration in which the laser beam is scattered at the lower surface of the heat shield.

Further, the return reflection method essentially requires application of a magnetic field in order to smoothen the melt surface. In addition, the return reflection method has another problem that it involves a lot of effort in measurement and calculation to obtain the position of the actual melt level A4.

The present invention has been made in view of the problems as described above, and it is an object of the invention to provide an improved CZ method of pulling single crystals for reducing the variation in quality among single crystals and ensuring stable growth of high-quality single crystals, the method being capable of easily measuring the melt level of the surface of melt and a distance between the melt level and a predetermined surface of a member inside a CZ furnace when an interval is small between a single crystal to be pulled and the member inside the CZ furnace or between the member inside the CZ furnace and the melt surface in the crucible, or when a magnetic field is applied.

Means for Solving the Problems

In order to achieve the object as described above, a first aspect of the invention provides a position measuring method for measuring a position of a measurement area based on a principle of triangulation in which a light source and a photo detector are provided so that light emitted from the light source is applied to the measurement area, and the light reflected by the measurement area is received by the photo detector. The method is characterized by including the steps of: providing a member in the vicinity of the measurement area; and causing the emitted light to be reflected by the member, applying the reflected light to the measurement area, and causing the reflected light reflected by the measurement area to be received by the photo detector; or applying the emitted light to the measurement area, causing the light reflected by the measurement area to be reflected by the reflection member, and causing the reflected light to be received by the photo detector.

A second aspect of the invention provides a position measuring method for measuring a surface level of melt in a crucible arranged in the inside of a Czochralski furnace based on a principle of triangulation in which a light source and a photo detector are provided so that light emitted from the light source is applied to the surface of the melt and the light reflected by the melt surface is received by the photo detector. The method is characterized by including the steps of: providing a member in the vicinity of the measurement area; and causing the emitted light to be reflected by the member, applying the reflected light to the measurement area, and causing the light reflected by the measurement area to be received by the photo detector; or applying the emitted light to the melt surface, causing the light reflected by the melt surface to be reflected by the member, and causing the reflected light to be received by the photo detector.

The first and second aspects of the invention will be described with reference to FIGS. 1A and 1B.

Figure 1A:
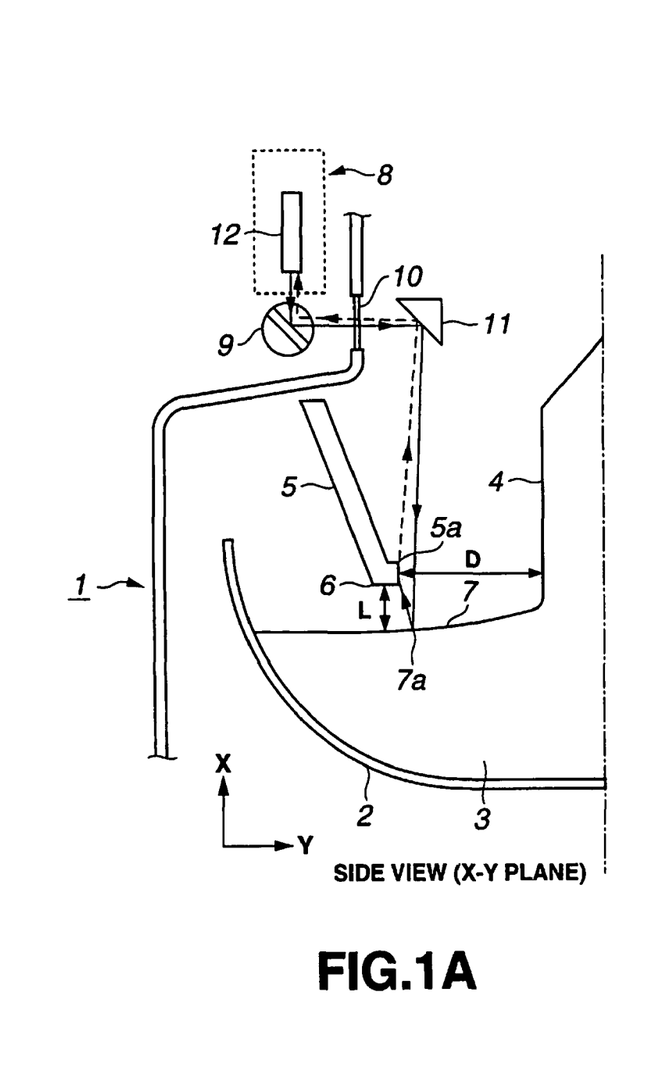
FIGS. 1A and 1B are a diagram for explaining a position measuring method according to a first embodiment of the present invention.
Figure 1B:
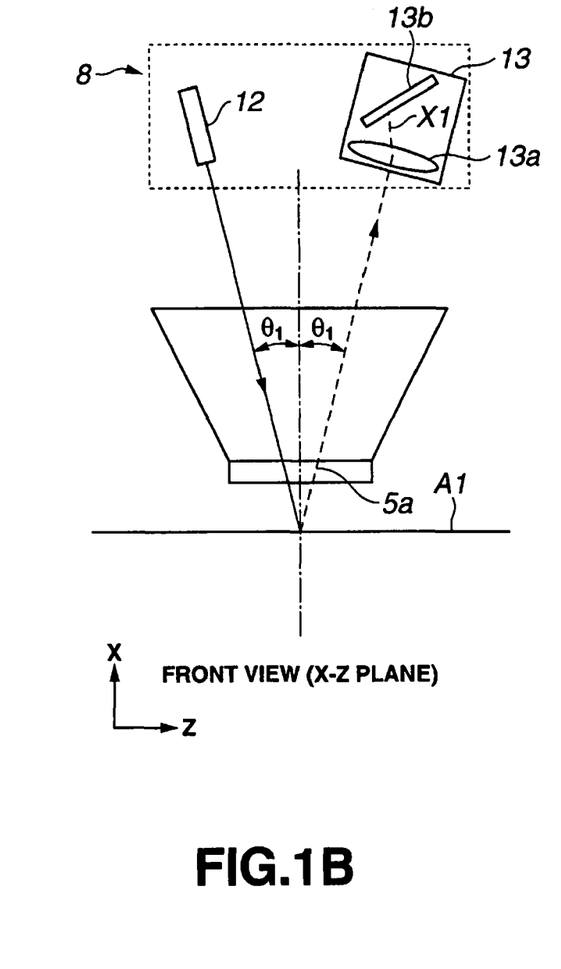

As shown in FIGS. 1A and 1B, a distance measurement unit 8 comprising a laser beam source 12 and a photo detector 13 is used for measuring a melt level position based on a principle of triangulation. A laser beam emitted by the laser beam source 12 is guided to a side surface 5a of a heat shield 5 by means of a rotating mirror 9 and a prism 11 so that the laser beam is reflected by the side surface 5a. The reflected light is then applied to a melt surface 7, and the reflected light reflected by the melt surface 7 is received by a one-dimensional CCD sensor 13b in the photo detector 13. Alternatively, the laser beam is first applied to the melt surface 7, and the reflected light reflected by the melt surface 7 is reflected by the side surface 5a of the heat shield 5. The reflected light is finally received by the one-dimensional CCD sensor 13b after passing through a plurality of optical elements.

As seen from FIG. 1B, the laser beam trajectory as seen from the front (in the X-Z plane) is not changed in angle within the X-Z plane by the reflection at the side surface 5a of the heat shield. Therefore, measurement of the melt level (the height in an X-axis direction) is possible based on the principle of triangulation.

A third aspect of the invention relates to the second aspect of the invention and is characterized in that the member is a heat shield provided in the inside of the Czochralski furnace.

Figure 3A:
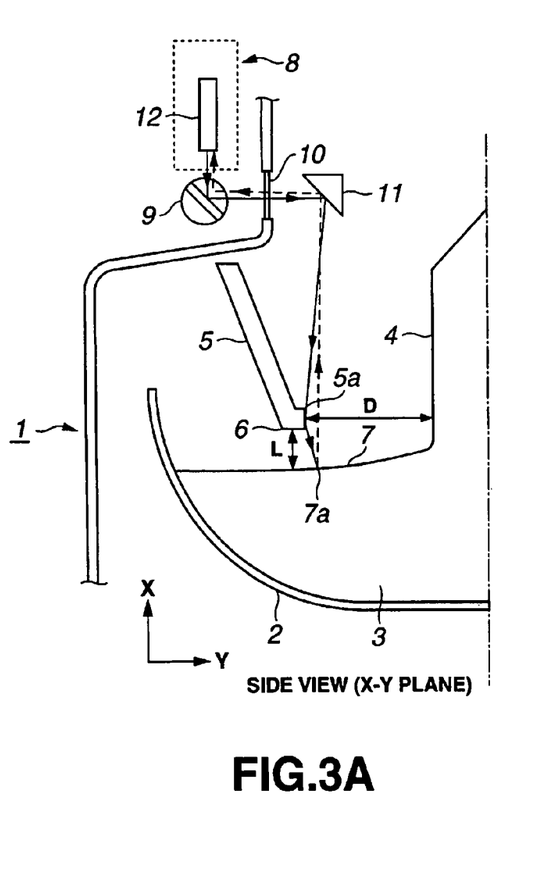
FIGS. 3A and 3B are a diagram for explaining a position measuring method according to a second embodiment of the present invention.
Figure 3B:
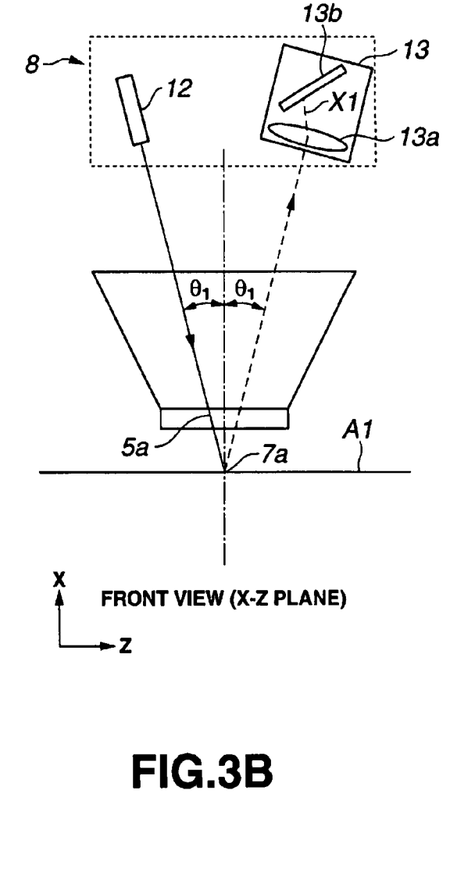

In FIGS. 1 and 3, the heat shield 5 used in a single-crystal pulling device for the CZ method is a member arranged in the vicinity of the melt surface 7, and thus can be utilized as a suitable reflection member in the present invention.

A fourth aspect of the invention relates to the second aspect of the invention, and is characterized in that the member is a cooler pipe or purge tube provided in the Czochralski furnace or an in-furnace side surface member.

In FIGS. 1 and 3, the cooler pipe, the purge tube or the in-furnace side surface member, etc. arranged in the vicinity of the melt surface 7 may be used in place of the heat shield as the reflection member.

Effects of the Invention

According to the first aspect of the invention, stable position measurement is made possible by using a member in the vicinity of a measurement area to scatter the return light.

According to the second aspect of the invention, the frequency of measurement can be set high and the need of high laser power is eliminated by using a member in the vicinity of a measurement area to scatter the return light. Further, even if the interval D and the interval L are small, measurement of the melt level and the interval L can be performed in a relatively stable manner.

According to the third aspect of the invention, the side surface 5a of the heat shield 5 arranged in the vicinity of the melt surface 7 can be used as the reflection member, and hence low-angle reflection is made easy.

According to the fourth aspect of the invention, the cooler pipe, the purge tube, or the in-furnace side surface member arranged in the vicinity of the melt surface 7 can be used as the reflection member. Therefore, when low-angle reflection is to be performed within the CZ furnace, the reflection member can be selected appropriately so that the low-angle reflection can be performed under suitable conditions.

EXPLANATION OF REFERENCE NUMERALS

A1 to A4: Melt level
D: Interval between the inner circumference of the lower end portion of the heat shield and the peripheral wall of a single crystal being pulled;
L: Interval between the lower surface of the heat shield and the melt surface;

| | |
|---|---|
| 1: | CZ furnace |
| 2: | Crucible |
| 3: | Silicon material |
| 4: | Silicon single crystal |
| 5: | Heat shield |
| 6: | Lower surface of heat shield |

-continued

| 7: | Melt surface |
| 8: | Distance measurement unit |
| 9: | Rotating mirror |
| 10: | Entrance window |
| 11: | Prism |
| 12: | Laser beam source |
| 13: | Photo detector |
| 13a: | Optical lens |
| 13b: | One-dimensional CCD sensor |

BEST MODE FOR CARRYING OUT THE INVENTION

Exemplary embodiments of a position measuring method according to the present invention will be described with reference to the drawings.

Although a red laser beam is used as a light source in the exemplary embodiments described below, the following description will be made referring to it simply as the laser beam for avoiding complexity.

First Embodiment

FIGS. 1A and 1B are a diagram for explaining a position measuring method according to a first embodiment of the present invention. FIG. 1A is a schematic diagram showing a laser beam trajectory of the first embodiment as viewed from a side (in the X-Y plane). FIG. 1B is a schematic diagram showing a laser beam trajectory of the first embodiment as viewed from the front (in the X-Z plane). Although the laser beam is guided by a rotating mirror 9 and a prism 11 in FIG. 1A, the rotating mirror 9 and the prism 11 are omitted in FIG. 1B since the laser beam trajectory in a Y-axis direction is perpendicular to the paper surface of the figure. Further, other parts and components that are not essential in terms of the triangulation are also omitted for simplification of illustration.

In FIGS. 1A and 1B, a silicon material 3 is molten within a crucible 2 provided in a CZ furnace 1, and a silicon single crystal 4 is grown while being rotated and pulled upward in the figure. A heat shield 5 is arranged around the outside of the silicon single crystal 4. An interval between an inner circumference of a lower portion of the heat shield 5 and a peripheral wall of the silicon single crystal 4 is represented by D, and an interval between a lower surface 6 of the heat shield 5 and a melt surface 7 is represented by L.

A distance measurement unit 8 designed based a principle of triangulation is employed for measuring a melt level A1 of the melt surface 7. There are provided, in the inside of this distance measurement unit 8, a laser beam source 12 for applying a laser beam to the melt surface 7 and a photo detector 13 for receiving the laser beam reflected by the melt surface 7. There are provided, in the inside of the photo detector 13, a lens 13a for collecting an incident laser beam and a one-dimensional CCD sensor 13b for detecting the collected laser beam.

A laser beam emitted by the distance measurement unit 8 is reflected by the rotating mirror 9, passes through an entrance window 10, and is applied directly to the melt surface 7 via the prism 11 provided in the CZ furnace 1.

The reflected light reflected by the melt surface 7 is incident on a side surface 5a of the heat shield 5 provided in the vicinity of the melt surface 7, at a low angle of incidence of 0.5 degrees or less that is substantially parallel to a lateral direction. The reflected light then reflected at the same low angle is guided by the prism 11, the entrance window 10, and the rotating mirror 9, and received by the photo detector 13.

The rotating mirror 9 may be rotated as required to ensure the laser beam to be incident to the side surface 5a of the heat shield 5. For example, scanning with the laser beam may be made in a radial direction of the crucible in the CZ furnace by rotating the rotating mirror 9. Alternatively, the rotating mirror 9 may be preliminarily fixed to define accurate alignment.

In the X-Z plane of FIG. 1B, a laser beam, that has been applied from the laser beam source 12 to the melt surface 7 at an angle of incidence $\theta 1$, is reflected at an angle of reflection $\theta 1$. In the X-Y plane of FIG. 1A, the laser beam reflected by the melt surface 7 is once reflected at the side surface 5a of the heat shield 5 at a low angle of 0.5 degrees or less, that is substantially parallel to the lateral direction. During the reflection at the side surface 5a, the angle in the X-Z plane is not changed but only the angle in a Y-axis direction is changed. The laser beam thus travels toward the one-dimensional CCD sensor 13b, maintaining the angle $\theta 1$ in the X-Z plane and is detected at the measurement coordinates X1. The melt level A1 corresponds to the measurement coordinates X1 of the one-dimensional CCD sensor 13b.

As described above and shown in FIG. 1B, the angle of the laser beam in the X-Z plane is not changed by the reflection at the side surface 5a of the heat shield. Accordingly, the height position in an X-axis direction, that is, the melt level can be measured by performing triangulation in the X-Z plane.

The term "side surface" as used in the present invention means a surface that is not inclined more than 0.5 degrees with respect to a vertical surface.

Figure 2:
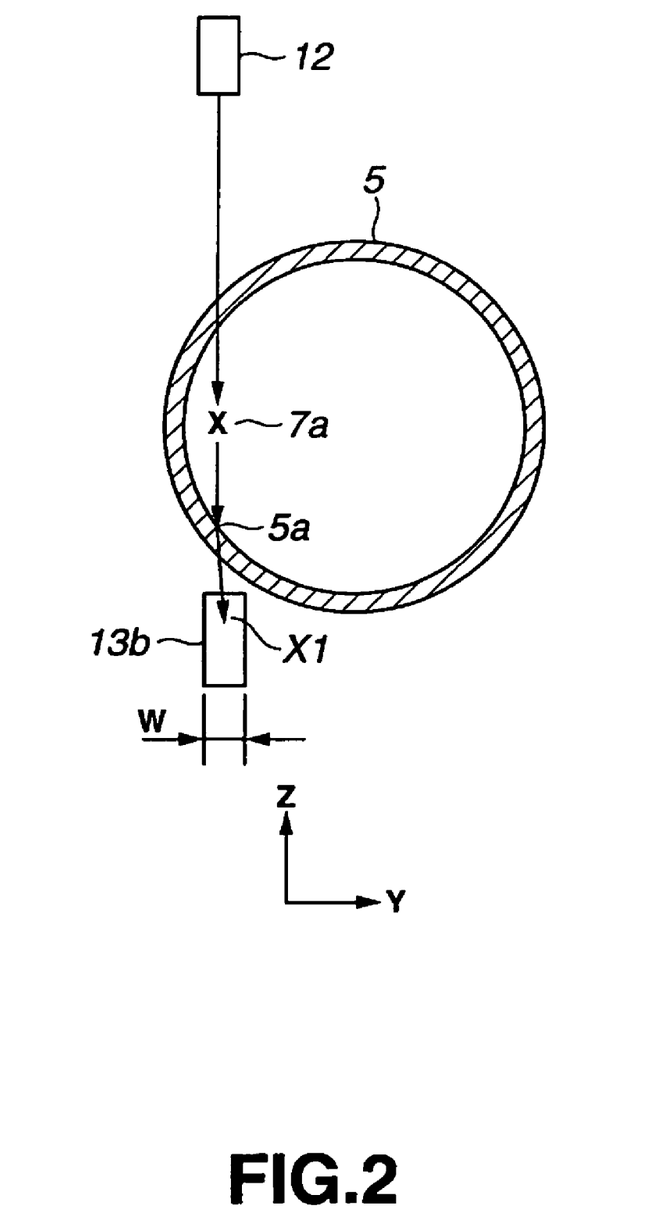
FIG. 2 is a schematic diagram showing a laser beam trajectory of the first embodiment as viewed from above (in the Y-Z plane)

FIG. 2 is a schematic diagram showing a laser beam trajectory of the first embodiment, as viewed from above (in the Y-Z plane).

As shown in FIG. 2, a laser beam emitted by the laser beam source 12 and reflected at a reflection point 7a on the melt surface 7 is reflected by the side surface 5a of the heat shield 5 while the angle is changed in the Y-axis direction. The laser beam the angle of which has been changed is finally received by the one-dimensional sensor 13b at the measurement coordinates X1. Therefore, in order to receive the laser beam the angle of which has been changed, the offset distance of the laser beam at the light receiving position must be smaller than the width W in the Y-axis direction of the one-dimensional CCD sensor 13b. The offset distance need be checked by calculation or experiments in advance.

Second Embodiment

FIGS. 3A and 3B are a diagram for explaining a position measuring method according to a second embodiment of the present invention. FIG. 3A is a schematic diagram showing a laser beam trajectory of the second embodiment as viewed from a side (in the X-Y plane). FIG. 3B is a schematic diagram showing the laser beam trajectory of the second embodiment as viewed from the front (in the X-Z plane). The second embodiment is different from the first embodiment in the laser beam trajectory, but the configuration of the second embodiment is basically the same as that of FIGS. 1A and 1B.

A laser beam emitted by the laser beam source 12 at an angle of incidence $\theta 1$ with respect to the X-Z plane is first reflected by a side surface 5a of the heat shield. The reflected light is then applied to the melt surface 7. The angle of the laser beam is not changed in the X-Z plane, but only the angle of the laser beam in a Y-axis direction is changed. This means that the angle of incidence in the X-Z plane of the laser beam applied to the melt surface 7 is equal to $\theta 1$. The laser beam is reflected at a reflection point 7a on the melt surface 7 and then travels to the one-dimensional CCD sensor 13b, and detected at the measurement coordinates X1 corresponding to the melt level A1.

The rotating mirror 9 may be rotated as required to ensure the laser beam to be incident to the side surface 5a of the heat shield 5. For example, scanning with the laser beam can be made in a radial direction of the crucible in the CZ furnace by rotating the rotating mirror 9. Alternatively, the rotating mirror 9 may be preliminarily fixed to define accurate alignment.

According to FIG. 3B, the angle of the laser beam is not changed in the X-Z plane. Accordingly, the height position in an X-axis direction, that is, the melt level can be measured by performing triangulation based on the measurement in the X-Z plane. The melt level A1 can be obtained based on the measurement coordinates X1 of the one-dimensional CCD sensor 13b.

Figure 4:
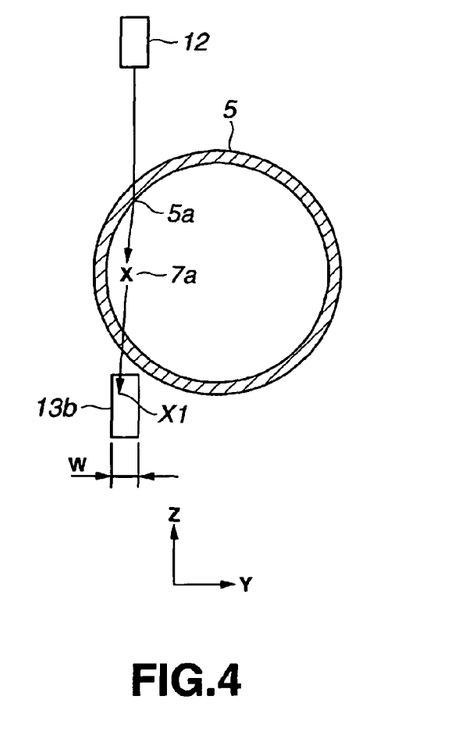
FIG. 4 is a schematic diagram showing a laser beam trajectory of the second embodiment as viewed from above (in the Y-Z plane)

FIG. 4 is a schematic diagram showing the laser beam trajectory as viewed from above (Y-Z plane).

As shown in FIG. 4, a laser beam emitted by the laser beam source 12 is reflected by the side surface 5a of the heat shield 5 and the angle in a Y-axis direction is changed. The laser beam the angle of which has been changed is applied to the melt surface 7, and the laser beam reflected at the reflection point 7a on the melt surface 7 is finally received by the one-dimensional sensor 13b. Therefore, in order to ensure reception of the laser beam the angle of which has been changed, the offset distance of the laser beam at the light receiving position must be smaller than the width W in the Y-axis direction of the one-dimensional CCD sensor 13b. The offset distance need be checked in advance by calculation or experiments.

The first embodiment and the second embodiment are different from each other only in the time point when the reflection by the side surface 5a of the heat shield 5 is performed, and they are basically the same in effect. Therefore, either the first embodiment or the second embodiment may be employed in actual position measurement.

According to the present invention, the frequency of measurement (number of measurements per unit time) can be set high due to the use of scattered light. Further, the laser power need not be high due to the employment of the low-angle reflection method in which the number of reflection at the melt surface is only one and the reduction in intensity of the reflected light is relatively low.

Figure 5:
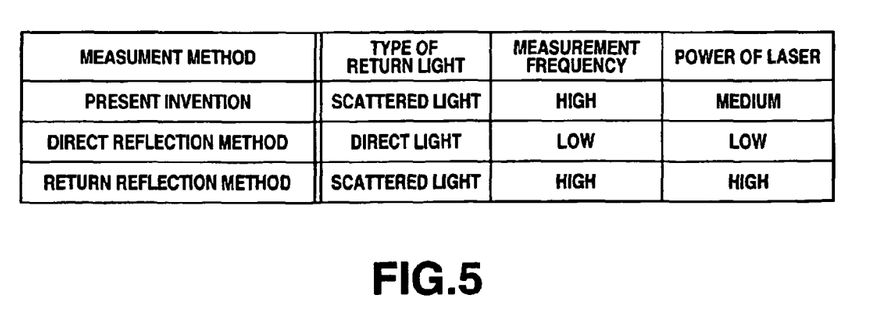
FIG. 5 is a diagram comparing the measurement method of the present invention and conventional measurement methods in terms of frequency of measurement and laser power.

FIG. 5 is a diagram comparing the measurement method of the present invention and conventional measurement methods in terms of frequency of measurement and laser power.

As seen from FIG. 5, in the direct reflection method, the return light is directly reflected light and hence the laser power can be set low. However, since the direct reflection method depends on the surface shape of the melt surface, the reflected light directly reflected by the reflector cannot be received stably and hence the frequency of measurement cannot be set high. As for the return reflection method, the return light is scattered light and hence the frequency of measurement can be set high. However, the laser power must be set high. A high laser power requires a large-sized device and poses a problem in safety.

In contrast, according to the present invention, the return light is scattered light and hence the frequency of measurement can be set high, while the laser power need not be high. This enables the use of a safe and small-sized laser beam source.

Figure 6:
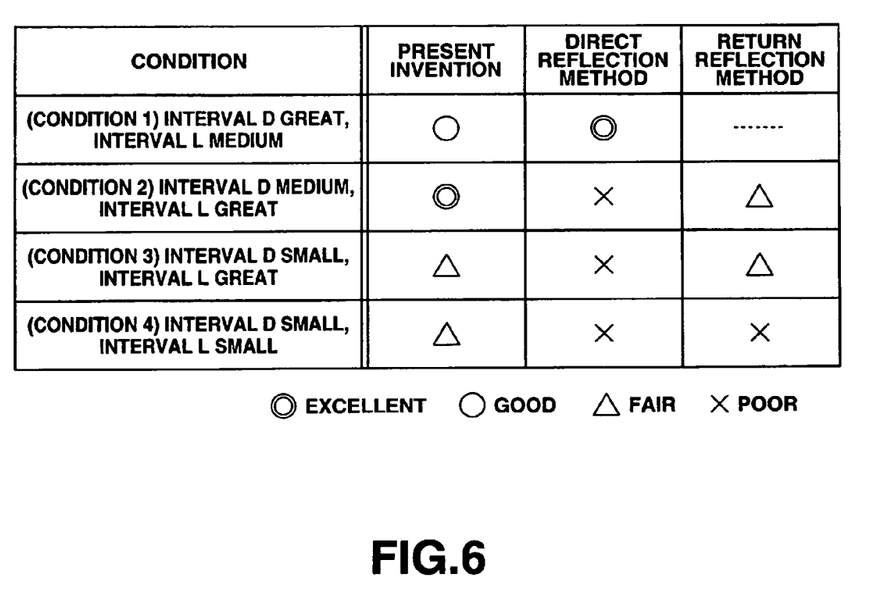
FIG. 6 is a diagram comparing the measurement method of the present invention and conventional measurement methods in terms of measurement stability.

FIG. 6 is a diagram comparing the measurement method according to the present invention and the conventional measurement methods in terms of the measurement stabilities. An interval D between the heat shield and the single crystal and an interval L between the lower surface of the heat shield and the melt surface are used as parameters.

Condition 1: the Interval D is Great and the Interval L is Medium

The method of present invention was evaluated as GOOD, and the direct reflection method was evaluated as EXCELLENT. No evaluation was conducted on the return reflection method.

Condition 2: the Interval D is Medium and the Interval L is Great

The method of the present invention was evaluated as EXCELLENT, whereas the direct reflection method was evaluated as POOR. The return reflection method was evaluated as FAIR.

Condition 3: the Interval D is Small and the Interval L is Great

The method of the present invention and the return reflection method were evaluated as FAIR, whereas the direct reflection method was evaluated as POOR.

Condition 4: the Interval D is Small and the Interval L is Small

The method of the present invention was evaluated as FAIR whereas the direct reflection method and the return reflection method were evaluated as POOR.

As seen from FIGS. 5 and 6, the frequency of measurement can be set high according to the present invention. Although being inferior to the direct reflection method in Condition 1, the method of the present invention is superior in Conditions 2 to 4. It is required to reduce the interval D and the interval L in order to improve the quality of silicon single crystals. Therefore, the method of the present invention is particularly effective in that regard.

Although the above description of the embodiments has been made on the assumption that a heat shield is used as a member for a low-angle reflection, another component within the furnace such as a cooler pipe, a purge tube, or a side surface member may be used instead. When low-angle reflection is to be performed, an appropriate one may be selected and used under suitable conditions.

Although the above description of the embodiments has been made in terms of the case in which the melt level in the CZ furnace is measured, the present invention is not limited to the embodiments described above.

Specifically, the present invention may be applied as a position measuring method in which a member is provided in the vicinity of a measurement area so that light emitted from a laser beam source is applied to the measurement area after being reflected by the member and the reflected light reflected by the measurement area is received by the photo detector. Alternatively, the present invention may be applied as a position measuring method in which emitted light is applied to the measurement area, and the reflected light reflected by the measurement area is received by the photo detector after being reflected by the reflection member.

When return light from the measurement area becomes instable using the direct reflection method, for example, it is made possible to perform the position measurement at a stable frequency of measurement by using a member in the vicinity of the measurement area to scatter the return light.

Although a red laser beam source is used as the light source in the embodiments described above, the present invention is not limited to this but a purple, blue, or green laser beam source may be used instead of the red laser beam source.

The use of such a laser beam source having a wavelength of 400 nm to 550 nm makes it possible to keep the wavelength away from of a yellow, red or near-infrared wavelength of ghost light generated in the inside of the CZ furnace. Therefore, the relative light receiving sensitivity of the CCD sensor is improved, and thus accurate position measurement is made possible.

Further, in the present invention, a general light source such as xenon, mercury or halogen, or a single wavelength light source such as a sodium line may be used in place of the laser beam source. While the use of the laser beam source enables accurate detection of the measurement coordinates and thus accurate position measurement is made possible, a different type of light source may be used if required.

The invention claimed is:

1. A position measuring method for measuring a surface level of melt in a CZ furnace based on a principle of triangulation, in which a light source and a photo detector are provided; light emitted from the light source is applied to a surface of the melt; and the light reflected by the surface of the melt is received by the photo detector, wherein the method is a position measuring method for measuring the surface level of the melt between a member in the CZ furnace and a single crystal, and the method comprises:

arranging a heat shield outside a single crystal inside the CZ furnace, causing the emitted light to be reflected by a side surface of an inner circumference of a lower end portion of the heat shield, and applying the reflected light to the melt surface, and causing the reflected light reflected by the surface of the melt to be received by the photo detector; or applying the emitted light to the surface of the melt, causing the light reflected by the surface of the melt to be reflected by the side surface of the inner circumference of the lower end portion of the heat shield, and causing the reflected light to be received by the photo detector, the emitted light reflecting off the surface of the melt only once before reaching the photo detector.

2. A position measuring method for measuring a surface level of melt in a CZ furnace based on a principle of triangulation, in which a light source and a photo detector are provided; light emitted from the light source is applied to a surface of the melt; and the light reflected by the surface of the melt is received by the photo detector, wherein the method is a position measuring method for measuring the surface level of the melt between a member in the CZ furnace and a single crystal, and the method comprises:

arranging a heat shield outside a single crystal inside a CZ furnace, rotating a rotating mirror to scan by the emitted light emitted from the light source in a radial direction of the crucible in the CZ furnace to ensure the light to be reliably applied to a side surface of the member facing the single crystal;

causing the emitted light to be reflected by the side surface of an inner circumference of a lower end portion of the heat shield, via the rotating mirror, applying the reflected light to the surface of the melt, and causing the reflected light reflected by the surface of the melt to be received by the photo detector; or applying the emitted light to the surface of the melt via the rotating mirror, causing the light reflected by the surface of the melt to be reflected by the side surface of the inner circumference of the lower end portion of the heat shield, and causing the reflected light to be received by the photo detector, the emitted light reflecting off the surface of the melt only once before reaching the photo detector.

* * * * *